United States Patent
Prizzi et al.

[11] Patent Number: 5,879,823
[45] Date of Patent: Mar. 9, 1999

[54] COATED CUTTING TOOL

[75] Inventors: John J. Prizzi; Prem C. Jindal, both of Hempfield Township; William A. Bryant, McKeesport; Bernard North, Greensburg, all of Pa.

[73] Assignee: Kennametal Inc., Latrobe, Pa.

[21] Appl. No.: 570,852

[22] Filed: Dec. 12, 1995

[51] Int. Cl.$^6$ ................................................ B23B 27/14
[52] U.S. Cl. ............................ 428/698; 428/469; 428/472; 428/697; 428/699; 428/701; 428/702; 51/307; 51/309; 407/119
[58] Field of Search .................................... 428/698, 697, 428/699, 701, 702, 704, 469, 472, 408; 51/307, 309; 407/119

[56] References Cited

U.S. PATENT DOCUMENTS

| | | | |
|---|---|---|---|
| 4,019,873 | 4/1977 | Reiter | 428/217 |
| 4,474,849 | 10/1984 | Fujimori et al. | 428/332 |
| 4,696,352 | 9/1987 | Buljan et al. | 175/57 |
| 4,753,854 | 6/1988 | Gavrilov et al. | 428/698 |
| 4,761,346 | 8/1988 | Nark | 428/627 |
| 4,828,612 | 5/1989 | Yohe | 75/238 |
| 4,984,940 | 1/1991 | Bryant et al. | 407/119 |
| 5,075,181 | 12/1991 | Quinto et al. | 428/698 |
| 5,162,147 | 11/1992 | Ruppi | 428/216 |
| 5,188,489 | 2/1993 | Santhanam et al. | 407/119 |
| 5,208,102 | 5/1993 | Schulz et al. | 428/697 |
| 5,250,367 | 10/1993 | Santhanam et al. | 428/698 |
| 5,264,297 | 11/1993 | Jindal et al. | 428/698 |
| 5,266,388 | 11/1993 | Santhanam et al. | 428/212 |
| 5,266,389 | 11/1993 | Omori et al. | 428/704 |
| 5,296,016 | 3/1994 | Yoshimura et al. | 75/238 |
| 5,325,747 | 7/1994 | Santhanam et al. | 82/1.11 |
| 5,330,853 | 7/1994 | Hoffmann et al. | 428/697 |
| 5,364,209 | 11/1994 | Santhanam et al. | 407/119 |
| 5,487,625 | 1/1996 | Ljungberg et al. . | |
| 5,525,420 | 6/1996 | Kaufmann | 428/336 |
| 5,549,975 | 8/1996 | Schulz et al. | 428/553 |

FOREIGN PATENT DOCUMENTS

| | | |
|---|---|---|
| 0353060 | 1/1989 | European Pat. Off. . |
| 0488720 | 6/1990 | European Pat. Off. . |
| 448720 | 10/1991 | European Pat. Off. . |
| 0 513 662 | 11/1992 | European Pat. Off. . |
| 0588351 | 3/1993 | European Pat. Off. . |
| 0709483 | 5/1996 | European Pat. Off. . |
| 0744472 | 11/1996 | European Pat. Off. . |
| 54-2982 | 1/1979 | Japan . |
| 54-158775 | 12/1979 | Japan . |
| 57-73178 | 5/1982 | Japan . |
| 57-120667 | 7/1982 | Japan . |
| 61-79760 | 4/1986 | Japan . |
| 2095502 | 4/1990 | Japan . |
| 3-17251 | 1/1991 | Japan . |
| 4308075 | 10/1992 | Japan . |
| 1284030 | 8/1970 | United Kingdom . |
| 2109415 | 8/1982 | United Kingdom . |

OTHER PUBLICATIONS

UK Examiner's Search Report date Jan. 15, 1997.
Hansson et al., "Characteristics of the $\kappa Al_2O_3$ $\alpha$–$Al_2O_3$ transformation in different single layer coatings of CVD $\kappa$–$Al_2O_3$", Surface Coatings Technology 76–77 (1995), pp. 256–264.
Halvarsson et al. "The influence of the nucleation surface on the growth of CVD–$\alpha Al_2O_3$ and $\kappa$–$Al_2O_3$", Surface and Coatings Technology 76–77 (1995), pp. 287–296.

(List continued on next page.)

*Primary Examiner*—Archene Turner
*Attorney, Agent, or Firm*—Stanislav Antolin

[57] ABSTRACT

A coated cutting tool that has a rake face and a flank face with a cutting edge at the juncture of the rake and flanks faces, a substrate, and a coating bonded to the substrate. The coating has a coating scheme that includes a layer of a Group IVB metal-aluminum alloy applied by physical vapor deposition, and a layer of alumina applied by physical vapor deposition to the layer of the Group IVB metal-aluminum alloy.

24 Claims, 2 Drawing Sheets

OTHER PUBLICATIONS

Halvarsson et al. "Determination of the thermal expansion of κ–$Al_2O_3$ by high temperature XRD", Surface and Coatings Technology 76–77 (1995), pp. 358–362.

Whitney, E. D., "Modern Ceramic Cutting Tool Materials", Powder Met. Int'l., vol. 15, No. 4 (1983), pp. 201–205.

Whitney, E. D., "Ceramic Cutting Tools", Power Met. Int'., vol. 6, No. 2 (1974), pp. 73–76.

Santhanam et al. "Cemented Carbides", Metals Handbook, vol. 2, 10th ed. (1990), pp. 950–977.

Reiter et al., "Coated Hardmetals for Increasing the Productivity of Machining", Lecture in November of 1987 before the Society of German Engineers (VD7).

Knotek et al., "Sputtered Hard Materials Baed on Titanium and Aluminum for Wear Protection", Internat. Pulvermet. Tagung, DDR, Dresden (1985) pp. 181–196.

Sumomogi et al., "Adhesion Evaluation of RF–Sputtered Aluminum Oxide and Titanium Carbide Thick Films Grown on Carbide Tools", Thin Solid Films, vol. 79 (1981) pp. 91–100.

Shinzato et al., "Internal Stress in Sputter–Deposited $Al_2O_3$ Films", Thin Solid Films, vol. 97 (1982) pp. 333–337.

Kazama et al., "Alumina Films by Ion Plating", Cailiao Kerue Jinzhan vol. 7, No. 6 (1993) pp. 521–525.

Roth et al., "Structure of Sputtered Amorphous Alumina Coatings", Z. Werkstofftech, vol. 18, No. 1 (1987) pp. 9–15.

Roth, "Structure, Internal Stresses, Adhesion and Wear Resistance of Sputtered Alumina Coatings", Thin Solid Films, vol. 153 (1987), pp. 123–133.

Ramos et al., "R.F. Sputtered Amorphous Alumina Coatings on High Speed Steel", Mat & Mfg. Proc., vol. 7, No. 2 (1992), pp. 251–269.

Ramos et al., "Adhesion Improvement of RF–Sputtered Alumina Coatings as Determined by the Scratch Test", J. Adhesion Sci. Tech., vol. 7, No. 8 (1993) pp. 801–811.

COATED CUTTING TOOL

BACKGROUND OF THE INVENTION

The invention concerns a coated cutting tool. More specifically, the invention pertains to a coated cutting tool wherein the coating scheme for the cutting tool includes a layer of a Group IVB metal-aluminum alloy applied by physical vapor deposition (PVD) and a layer of alumina applied by PVD to the layer of the Group IVB-aluminum alloy.

Alumina as a bulk material exhibits high oxidation resistance, high chemical stability, high hardness and good wear resistance. Alumina thus has desirable properties for use in material removal, e.g., metal removal, applications. Notwithstanding these desirable properties, the use of alumina cutting tools has certain drawbacks due to the low toughness and poor formability of alumina. To improve the cutting performance, some manufacturers have included additives such as chromium oxide, magnesium oxide, titanium oxide, nickel oxide and refractory metal carbides to the alumina-based cutting tool. The presence of these additives has resulted in alumina cutting tools with improved performance properties.

Another way to overcome the disadvantages of alumina and yet still achieve the beneficial properties thereof is to coat tougher and more readily formed cutting tool substrates with an alumina coating via physical vapor deposition (PVD) techniques. The end result of this process is an alumina-coated cutting tool.

While alumina-coated cutting tools achieve certain performance levels, there have been drawbacks with these tools. In this regard, the following documents concern the application of an amorphous alumina coating to a substrate.

The article by Knotek et al. entitled "Sputtered hard materials based on titanium and aluminum for wear protection", *International Pulvermet. Tagung.*, DDR, Dresden (1985), pp. 181–196, mentions the PVD (magnetron sputtering) application of separate coatings of alumina, TiN and TiAlN. The article states that these coatings have equivalent, or in the case of TiAlN better, performance than CVD coatings.

The Sumomogi et al article entitled "Adhesion Evaluation of RF-Sputtered Aluminum Oxide and Titanium Carbide Thick Films Grown on Carbide Tools", *Thin Solid Films*, 79 (1981), pp. 91–100, discusses the PVD application of alumina coatings on cemented carbide tools (ISO P20).

The Shinzato et al. article entitled "Internal Stress in Sputter-Deposited $Al_2O_3$ Films", *Thin Solid Films*, 97 (1982), pp. 333–337, mentions the application of an alumina coating to cemented carbide (ISO P20), high speed steel, and Corning Pyrex glass substrates via either a conventional r.f. apparatus or a planar magnetron r.f. apparatus.

The Kazama et al. article entitled "Alumina Films Prepared by Ion Plating" [alumina on a WC cutting tool], mentions the application of an alumina coating via ion plating to a WC substrate to from an alpha-alumina coating.

Japanese Patent Application S54-2982 to Murayama et al. addresses the use of the ion plating method to apply an alumina (or alumina and TiC) coating to a substrate. Practical Example II concerns the alumina coating on a cutting tool (ISO P30 alloy).

One drawback of alumina coated cutting tools pertains to the lack of adequate adhesion between the substrate and the alumina coating or layer. One way to improve the adhesion of the alumina coating is to provide an intermediate layer or layers. The following documents discuss the use of an intermediate layer.

In Ramos et al., "Adhesion improvement of RF-sputtered alumina coatings as determined by the scratch test", *Jour. Adhesion Sci. Technol.*, Vol. 7, No. 8, pp. 801–811 (1993), the authors looked at the use of a titanium or a titanium nitride intermediate layer between a high speed steel substrate (AISI M2) and an alumina coating applied via RF-sputtering. The overall conclusion was that the presence of a titanium or titanium nitride intermediate layer improves the adhesion of the alumina coating to the high speed steel substrate.

Japanese Patent Publication No. 57-120667 to Doi et al. mentions in the context of a cutting tool the PVD application of an intermediate layer of alumina over a base layer of TiC. The outer layer is TiN. This patent also mentions a six-layer coating scheme including alumina as the outer layer with TiC, alumina, TiCO as the intermediate layers using a plasma CVD device. Example No. 3 of this patent comprises an eight layer scheme in which the outer layer is alumina and the intermediate layers include TiC, alumina, TiCO and TiCN.

Japanese Patent Application No. H4-308075 to Matsuda et al. discusses the application by ion plating of an alumina coating to a substrate. The alumina may be applied directly to the surface of the substrate. The alumina may also be applied to an intermediate layer previously formed on the substrate. The intermediate layer may be titanium, titanium carbide or titanium nitride.

SUMMARY OF THE INVENTION

It is an object of the invention to provide an improved coated cutting tool wherein the coating scheme includes a layer of a Group IVB-aluminum alloy applied by PVD and a layer of alumina applied by PVD to the Group IVB-aluminum alloy layer.

It is an object of the invention to provide an improved coated cutting tool wherein the coating scheme includes at least one intermediate layer of a titanium-based composition applied by either chemical vapor deposition (CVD) or PVD to the substrate, a layer of a Group IVB-aluminum alloy applied by PVD to the outermost intermediate layer of the titanium-based composition, and a layer of alumina applied by PVD to the Group IVB-aluminum alloy layer.

It is an object of the invention to provide an improved coated cutting tool wherein the coating scheme includes at least one layer of a titanium-based composition applied by either CVD or PVD to the substrate, a layer of a Group IVB-aluminum alloy applied by PVD to the outermost intermediate layer of the titanium-based composition, a layer of alumina applied by PVD to the Group IVB-aluminum alloy layer, and at least one layer of the titanium-based composition applied by either CVD or PVD to the alumina layer.

It is an object of the invention to provide an improved coated cutting tool wherein the coating scheme includes a base layer of a Group IVB-aluminum alloy applied by PVD to the substrate and an outer layer of alumina applied by PVD to the Group IVB-aluminum alloy layer.

It is an object of the invention to provide an improved coated cutting tool wherein the coating scheme includes a base layer of a Group IVB-aluminum alloy applied by PVD to the substrate, a layer of alumina applied by PVD to the Group IVB-aluminum alloy layer, and at least one layer of a titanium-based composition applied by either CVD or PVD to the alumina layer.

It is an object of the invention to provide an improved coated cutting tool wherein the coating scheme includes at least one intermediate layer of a titanium-based composition applied by either CVD or PVD to the substrate, a layer of a Group IVB-aluminum alloy applied by PVD to the outermost intermediate layer of the titanium-based composition, and an outer layer of alumina applied by PVD to the Group IVB-aluminum alloy layer.

It is an object of the invention to provide an improved coated cutting tool wherein the coating scheme includes a layer of a Group IVB-aluminum alloy applied by PVD and a layer of alumina applied by PVD to the Group IVB-aluminum alloy layer wherein the Group IVB-aluminum alloy includes one or more of titanium, zirconium, and hafnium.

It is an object of the invention to provide an improved coated cutting tool wherein the coating scheme includes a layer of a Group IVB-aluminum alloy applied by PVD and a layer of alumina applied by PVD to the Group IVB-aluminum alloy layer wherein the Group IVB-aluminum alloy optionally includes one or more of the Group VB elements vanadium, tantalum, and niobium.

It is an object of the invention to provide an improved coated cutting tool wherein the coating scheme includes a layer of a Group IVB-aluminum alloy applied by PVD and a layer of alumina applied by PVD to the layer of the Group IVB-aluminum alloy wherein the layer of the Group IVB-aluminum alloy presents a compositional concentration gradient.

In one form thereof, the invention is a coated cutting tool that comprises a rake face and a flank face with a cutting edge being at the juncture of the rake face and the flank face. The cutting tool further includes a substrate and a coating bonded to the substrate. The coating has a coating scheme which includes a first layer of a titanium-aluminum alloy applied by physical vapor deposition, and a layer of alumina directly applied by physical vapor deposition to the first layer of the titanium-aluminum alloy.

In another form thereof, the invention is a coated cutting tool that comprises a rake face and a flank face with a cutting edge being at the juncture of the rake face and the flank face. The cutting tool further includes a substrate and a coating bonded to the substrate. The coating has a coating scheme which includes a first layer, wherein the first layer is applied by PVD and has a composition according to the following relationship: $(Ti_a\ Zr_b\ Hf_c\ V_d\ Ta_e\ Nb_f\ Al_{1-(a+b+c+d+e+f)})(N_xO_{1-x})$ wherein $0 \leq a < 1$; $0 \leq b < 1$; $0 \leq c < 1$; $0 \leq d < 1$; $0 \leq e < 1$; $0 \leq f < 1$; $0 \leq x \leq 1$; and $0 < (a+b+c+d+e+f) < 1$. The coating scheme further includes an alumina layer bonded to the first layer.

In still another form thereof, the invention is a coated cutting tool that comprises a rake face and a flank face with a cutting edge being at the juncture of the rake face and the flank face. The cutting tool further includes a substrate and a coating bonded to the substrate. The coating has a coating scheme which includes a first layer of a Group IVB metal-aluminum alloy applied by physical vapor deposition, and a layer of alumina directly applied by physical vapor deposition to the first layer of the Group IVB-aluminum alloy.

BRIEF DESCRIPTION OF THE DRAWINGS

The following is a brief description of the drawings that form a part of this patent application.

DETAILED DESCRIPTION OF PREFERRED EMBODIMENTS

Figure 1:
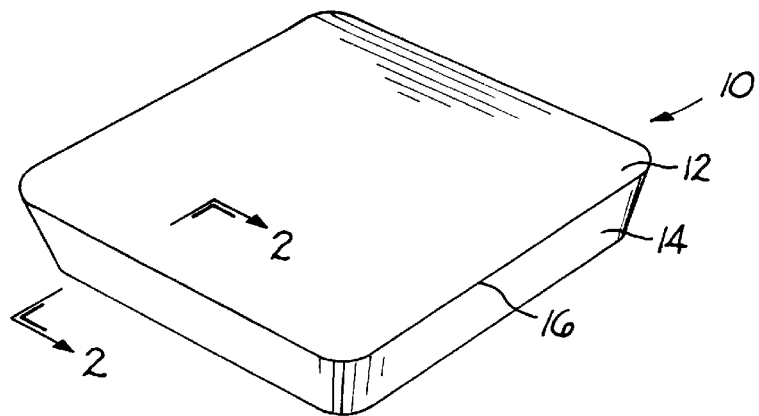
FIG. 1 is an isometric view of a specific embodiment of the cutting tool of the invention that has a base layer and an outer layer.

Referring to the drawings, FIG. 1 shows a first specific embodiment of the cutting tool of the invention, generally designated as 10. Cutting tool 10 has a rake face 12 and a flank face 14. A cutting edge 16 is at the juncture of the rake face 12 and the flank face 14.

The cutting tool presents a substrate with a multi-layer coating scheme wherein in selected embodiments some or all of the coating layers are applied via physical vapor deposition. There are a variety of PVD techniques by which one can apply a coating to a substrate to achieve a coated cutting tool. These techniques include any high ion density process such as, for example, ion plating, magnetron sputtering and arc evaporation.

In other selected embodiments, some of the coating layers may be applied by chemical vapor deposition (CVD). There are a variety of CVD processes that would achieve a satisfactory CVD layer.

Figure 2:
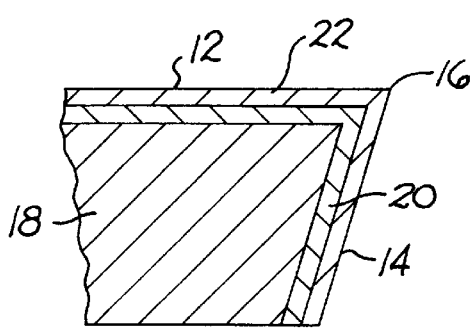
FIG. 2 is a cross-sectional view of the cutting tool of FIG. 1 taken along section line 2—2 showing a substrate, a base layer and an outer layer.

Referring to FIG. 2, cutting tool 10 has a substrate 18 along with a two layer coating scheme.

The base layer 20 is titanium aluminum nitride applied via a physical vapor deposition technique. The thickness of the TiAlN base layer 20 is between 1 and 6 micrometers. By using the TiAlN layer there is a good metallurgical bond between the tungsten carbide-cobalt substrate and the TiAlN base coating.

Still referring to FIG. 2, the cutting tool 10 also has an outer layer 22 of alumina applied via a physical vapor deposition technique. The thickness of the outer layer 22 is between 1 and 6 micrometers. The presence of the aluminum in the TiAlN should also promote the nucleation of alumina grains in the alumina outer coating on the titanium aluminum nitride layer surface.

Although not illustrated as a specific embodiment, applicants contemplate that the invention encompasses the substitution of titanium, aluminum or titanium-aluminum having a thickness of less than 0.5 micrometers for the titanium-aluminum-nitride of the first specific embodiment. Such a variation would result in a cutting tool with a substrate, a base coating of titanium aluminum applied by PVD and an outer coating of alumina applied by PVD.

Figure 3:
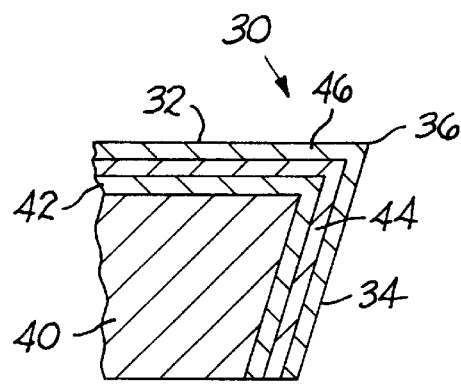
FIG. 3 is a cross-sectional view of another embodiment of the cutting tool of the invention showing a substrate, a base layer, an intermediate layer and an outer layer.

Referring to FIG. 3, the cutting tool 30 has a rake face 32 and a flank face 34. A cutting edge 36 is at the juncture of the rake face 32 and the flank face 34.

The cutting tool 30 further includes a substrate 40. The cutting tool 30 further includes a base layer 42 of titanium aluminum nitride deposited by physical vapor deposition techniques on the surface of the substrate 40. The base layer 42 is of a thickness between 1 and 6 micrometers. As mentioned before, this base layer forms a metallurgical bond with the substrate.

The cutting tool 30 further includes a mediate layer 44 of titanium, aluminum or titanium-aluminum applied by PVD to the surface of the titanium aluminum nitride layer 42. The mediate layer 44 has a thickness that is less than 0.5 micrometers.

The cutting tool finally includes an outer layer 46 of alumina that is applied via physical vapor deposition to the surface of the titanium aluminum mediate layer 44. The thickness of the outer layer 46 is between 1 and 6 micrometers. The presence of aluminum in the mediate layer helps promote the nucleation of alumina grains in the outer layer of alumina on the surface of the titanium aluminum layer 44.

Figure 4:
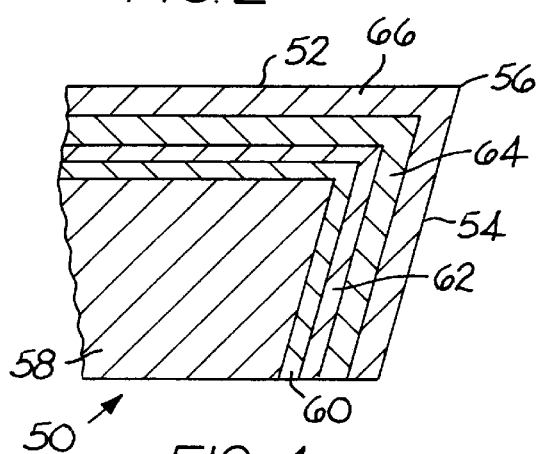
FIG. 4 is a cross-sectional view of still another embodiment of the cutting tool of the invention showing a substrate, two intermediate layers, a layer of a Group IVB-aluminum alloy, and an outer layer of alumina.

Referring to another embodiment of the cutting tool generally designated as 50 and illustrated in FIG. 4, cutting tool 50 includes a rake face 52, a flank face 54, and a cutting edge 56 at the intersection of the rake and flank faces (52, 54). Cutting tool 50 further includes a substrate 58.

Referring to the coating scheme, there are two intermediate layers 60, 62 of a titanium-based composition wherein the intermediate layer 60 (e.g., titanium nitride) is applied to the surface of the substrate. Intermediate layers 60, 62 may be applied by either chemical vapor deposition (CVD) or PVD. Intermediate layer 60 has a thickness between 1 micrometer and 4 micrometers. Intermediate layer 62 (e.g., titanium carbonitride) has a thickness between 1 micrometer and 4 micrometers.

A layer 64 of a titanium-aluminum alloy (e.g., titanium aluminum nitride) is applied to the surface of the intermediate layer 62 by PVD. Layer 64 has a thickness between 1 and 6 micrometers.

A layer 66 of alumina is applied by PVD to the surface of the titanium-aluminum alloy layer 64. Layer 66 has a thickness between 1 and 6 micrometers.

Figure 5:
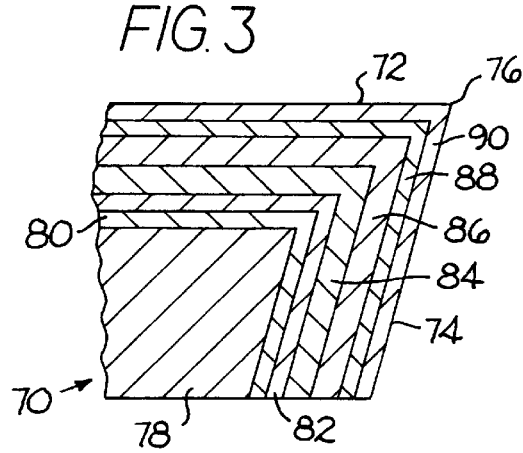
FIG. 5 is a cross-sectional view of another embodiment of the cutting tool of the invention showing a substrate, two intermediate layers, a layer of a Group IVB-aluminum alloy, a layer of alumina, and two outer layers.

Referring to still another embodiment of the cutting tool generally designated as 70 and illustrated in FIG. 5, cutting tool 70 includes a rake face 72, a flank face 74, and a cutting edge 76 at the intersection of the rake and flank faces (72, 74). Cutting tool 70 further includes a substrate 78.

Referring to the coating scheme, there are two intermediate layers 80, 82 of a titanium-based composition wherein the intermediate layer 80 (e.g., titanium nitride) is applied to the surface of the substrate. Intermediate layers 80, 82 may be applied by either CVD or PVD. Intermediate layer 80 has a thickness of between 1 micrometer and 4 micrometers. Intermediate layer 82 (e.g., titanium carbonitride) has a thickness of between 1 micrometer and 4 micrometers.

A layer 84 of a titanium-aluminum alloy (e.g., titanium aluminum nitride) is applied to intermediate layer 82 by PVD. Layer 84 has a thickness of 1 to 6 micrometers.

A layer 86 of alumina is applied by PVD to the titanium-aluminum alloy layer 84. Layer 86 has a thickness of 1 to 6 micrometers.

A pair of outer layers 88, 90 of a titanium-based composition are applied to the alumina layer 86 by either CVD or PVD. Outer layer 88 (e.g., titanium) has a thickness of less than 0.5 micrometers. Outer layer 90 (e.g., titanium nitride) has a thickness of between 1 micrometer and 4 micrometers. The outer layer 88 is applied directly to the surface of the alumina layer 86.

Figure 6:
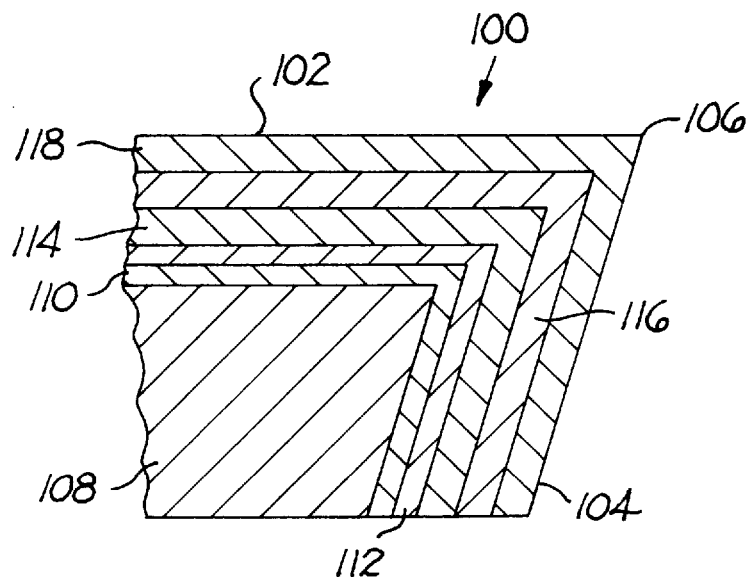
FIG. 6 is a cross-sectional view of another embodiment of the cutting tool of the invention showing a substrate, two intermediate layers, a layer of a Group IVB-aluminum alloy, another layer of a Group IVB-aluminum alloy, and an outer layer of alumina.

Referring to an additional embodiment of the cutting tool generally designated as 100 and illustrated in FIG. 6, cutting tool 100 includes a rake face 102, a flank face 104, and a cutting edge 106 at the intersection of the rake and flank faces (102, 104). Cutting tool 100 further includes a substrate 108.

Referring to the coating scheme, there are two intermediate layers 110, 112 of a titanium-based composition wherein the intermediate layer 110 (e.g., titanium nitride) is applied to the surface of the substrate. Intermediate layers 110, 112 may be applied by either CVD or PVD. Intermediate layer 110 has a thickness between 1 micrometer and 4 micrometers. Intermediate layer 112 (e.g., titanium carbonitride) has a thickness between 1 micrometer and 4 micrometers.

A layer 114 of a first titanium-aluminum alloy (e.g., titanium aluminum nitride) is applied to intermediate layer 112 by PVD. Layer 114 has a thickness of between 1 micrometer and 4 micrometers. A layer 116 of a second titanium-aluminum alloy (e.g., titanium aluminum nitride) is applied to the titanium-aluminum alloy layer 114 by PVD. Layer 116 has a thickness of between 1 micrometer and 4 micrometers. Preferably, the second titanium-aluminum alloy layer has a higher aluminum content than the first titanium-aluminum alloy layer.

A layer 118 of alumina is applied by PVD to the titanium-aluminum alloy layer 116. Layer 118 has a thickness of between 1 micrometer and 6 micrometers.

Figure 7:
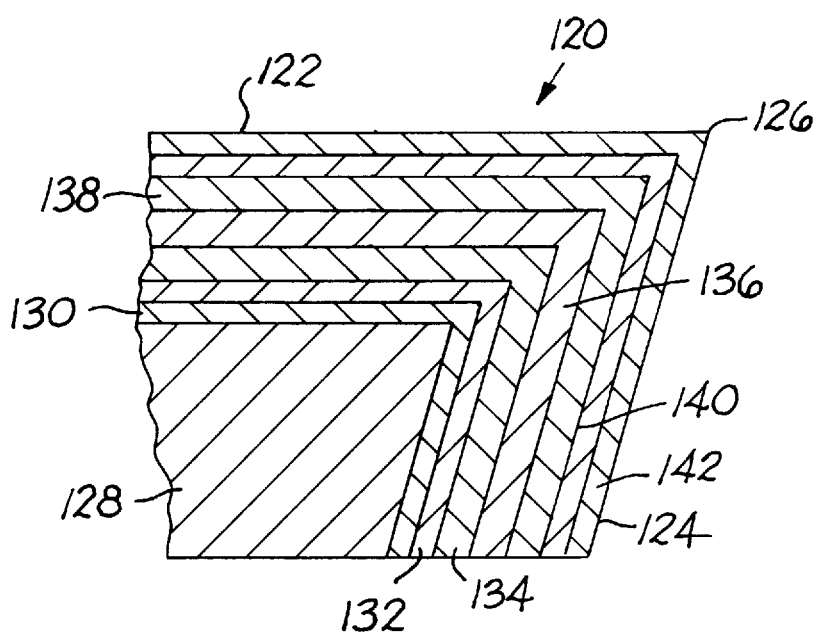
FIG. 7 is a cross-sectional view of another embodiment of the cutting tool of the invention showing a substrate, two intermediate layers, a layer of a Group IVB-aluminum alloy, another layer of a Group IVB-aluminum alloy, a layer of alumina, and two outer layers.

Referring to an embodiment of the cutting tool generally designated as 120 and illustrated in FIG. 7, cutting tool 120 includes a rake face 122, a flank face 124, and a cutting edge 126 at the intersection of the rake and flank faces (122, 124). Cutting tool 120 further includes a substrate 128.

Referring to the coating scheme, there are two intermediate layers 130, 132 of a titanium-based composition wherein the intermediate layer 130 is applied to the surface of the substrate. Intermediate layers 130, 132 may be applied by either CVD or PVD. Intermediate layer 130 (e.g., titanium nitride) has a thickness of between 1 micrometer and 4 micrometers. Intermediate layer 132 (e.g., titanium carbonitride) has a thickness of between 1 micrometer and 4 micrometers.

A first layer 134 of a first titanium-aluminum alloy (e.g., titanium aluminum nitride) is applied to intermediate layer 132 (e.g., titanium carbonitride) by PVD. Layer 134 has a thickness of between 1 micrometer and 4 micrometers. A second layer 136 of a second titanium-aluminum alloy (e.g., titanium aluminum nitride) is applied to the first titanium-aluminum alloy layer 134 by PVD. Layer 136 has a thickness of between 1 micrometer and 4 micrometers. Preferably, the second titanium-aluminum alloy layer has a higher aluminum content than the first titanium-aluminum alloy layer.

A layer 138 of alumina is applied by PVD to the surface of the second titanium-aluminum alloy layer 136. Layer 138 has a thickness of between 1 micrometer and 6 micrometers. A pair of outer layers 140, 142 of a titanium-based composition are applied to the alumina layer 138 by either CVD or PVD. If applied by PVD, the outer layer 140 (e.g., titanium) is applied directly to the surface of the alumina layer 138. Outer layer 140 has a thickness of less than 0.5 micrometers.

Outer layer 142 (e.g., titanium nitride) has a thickness of between 1 micrometer and 4 micrometers. If applied by CVD, the outer layer 140 may be titanium carbonitride and have a thickness of between 1 micrometer and 4 micrometers.

Referring to the embodiments described above, the substrate for these embodiments is tungsten carbide-cobalt-based cemented carbide; however, the substrate may be selected from the group consisting of various cemented carbides, cermets, ceramics, tool steels, cubic boron nitride-based cermets and ceramics, diamond-based compositions, and combinations and composites thereof.

Still referring to the embodiments described above, the most preferable alumina layer comprises a substantially crystalline alumina of any of the known crystalline phases of alumina. These crystalline phases include alpha (α) alumina, gamma (γ) alumina, delta (δ) alumina, theta (θ) alumina, kappa (κ) or eta (η) alumina, and khi (χ) alumina. See *Binary alloy phase diagrams,* Massalski (editor), American Society for Metals, Metals Park, Ohio (1990), p. 185. However, applicants contemplate that a layer of amorphous alumina alone or in combination with crystalline alumina is within the scope of the invention.

Referring to the above embodiments, the titanium-aluminum alloy most preferably comprises either titanium-aluminum or titanium aluminum nitride.

Still referring to the embodiments described above, the most preferably composition for the titanium-based composition of the intermediate layer or the outer layer comprises one or more of titanium carbide, titanium nitride, titanium carbonitride and the solution solids thereof.

In regard to the titanium-aluminum alloy layers of the embodiments described above, applicants contemplate as an alternate embodiment that any one or more of these layers may present concentration gradients therein. For example, in the embodiment of FIG. 2 wherein the base layer 20 is a titanium-aluminum alloy (e.g., titanium aluminum nitride), the composition of this titanium-aluminum alloy may be represented by the relationship: ($Ti_a Al_{1-a}$ N) wherein $0<a<1$ and the composition varies throughout the thickness of the layer. This relationship is also applicable to the other layers of titanium-aluminum alloy described above in conjunction with the above embodiments. Preferably, the aluminum content of the titanium-aluminum alloy layer increases toward the alumina layer.

In regard to the processes to produce a concentration gradient, U.S. Pat. No. 5,330,853 to Hofmann et al. for a MULTILAYER Ti—Al—N COATING FOR TOOLS, European Patent Application 0 448 720 Al to Omori et al. for a SURFACE-COATED HARD MEMBER FOR CUTTING AND ABRASION-RESISTANT TOOLS, and Japanese Patent Application No. 1-151953 to Ikeda et al. for ABRASION RESISTANT FILM discuss various coating schemes wherein the coating layers present concentration gradients therein. Applicants consider that the techniques disclosed in these documents would be suitable for the application of the layers of the titanium-aluminum alloy which present a concentration gradient.

Applicants also contemplate that the combination of the titanium-aluminum alloy layer(s) could be one continuous layer. The contents of the various elements would be varied so as to provide for a suitable continuous layer in which the composition varies according to the distance from the surface of the substrate. The composition of this one continuous layer may be represented by the relationship: ($Ti_x Al_{1-x}$) ($N_y O_{1-y}$) wherein $0x<1$ and $0 \leq y \leq 1$ in which the aluminum and oxygen contents of the titanium-aluminum alloy layers increase toward the alumina layer.

Applicants further consider the invention to encompass a cutting tool in which the coating scheme presents the titanium-aluminum alloy to optionally include one or more of the elements zirconium, hafnium, vanadium, tantalum and niobium. In this regard, the composition of the layer of the titanium-aluminum alloy would be represented by the following relationship: ($Ti_a$ $Zr_b$ $Hf_c$ $V_d$ $Ta_e$ $Nb_f$ $Al_1$-(a+b+c+d+e+f))(N) wherein $0<a<1$; $0 \leq b<1$; $0 \leq c<1$; $0 \leq d<1$; $0 \leq e<1$; $0 \leq f<1$; and $0<(a+b+c+d+e+f)<1$. The composition may vary through the thickness of the layer.

In an embodiment in which the coating scheme of the titanium-aluminum alloy (with metal addition) layers would comprise one continuous layer, the composition would be represented by the relationship: ($Ti_a$ $Zr_b$ $Hf_c$ $V_d$ $Ta_e$ $Nb_f$ $Al_1$-(a+b+c+d+e+f))(Nx $O_{1-x}$) wherein $0 \leq a<1$; $0 \leq b<1$; $0 \leq c<1$; $0 \leq d<1$; $0 \leq e<1$; $0 \leq f<1$; $0 \leq x \leq 1$; and $0<(a+b+c+d+e+f)<1$. The composition may vary through the thickness of the layer.

Furthermore, applicants consider the invention to include a cutting tool in which in the layers of the titanium alloy, the titanium may be substituted in whole or in part by zirconium and/or hafnium so that, for example, the composition of these layers may be represented by the relationship: ($Ti_a$ $Zr_b$ $Hf_c$) (N) wherein $0 \leq a<1$; $0 \leq b<1$; $0 \leq c<1$; and $a+b+c<1$. The composition may vary through the thickness of the layer.

In the situation in which the coating scheme of the titanium alloy layers would comprise one continuous layer, the composition would be represented by the following relationship: ($Ti_a$, $Zr_b$, $Hf_c$) (($N_x$, $O_{1-x}$) wherein $0<a \leq 1$; $0<b \leq 1$; $0<c \leq 1$; $a+b+c=1$ and $0 \leq x \leq 1$.

The patents and other documents identified herein are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A coated cutting tool comprising:
   a rake face and a flank face, a cutting edge being at the juncture of the rake face and the flank face, a substrate, and a coating bonded to the substrate; having a coating scheme including a first layer of a titanium-aluminum alloy directly applied by physical vapor deposition to the surface of the substrate, and a layer of alumina directly applied by physical vapor deposition to the surface of the first layer of the titanium-aluminum alloy.

2. The coated cutting tool of claim 1 wherein the first layer of the titanium-aluminum alloy is represented by the relationship ($Ti_a Al_{1-a}$N) wherein $0<a<1$, and the aluminum content of the first layer increases toward the alumina layer.

3. The coated cutting tool of claim 1 the first layer of the titanium-aluminum alloy comprises titanium aluminum.

4. The coated cutting tool of claim 1 wherein the first layer of titanium-aluminum alloy further includes one or more of the elements of zirconium, hafnium, vanadium, tantalum, and niobium.

5. The coated cutting tool of claim 1 wherein the substrate is selected from the group consisting of cemented carbides, cermets, ceramics, tool steels, cubic boron nitride-based cermets and ceramics, and diamond-based compositions.

6. The coated cutting tool of claim 1 wherein the substrate is a tungsten carbide-cobalt-based cemented carbide.

7. The coated cutting tool of claim 1 wherein the composition of the first layer of titanium-aluminum alloy changes through the thickness of the layer.

8. The coated cutting tool of claim 1 wherein the alumina comprises substantially crystalline alumina including one or more of the following crystalline phases of alumina: alpha ($\alpha$) alumina, gamma ($\gamma$) alumina, delta ($\delta$) alumina, theta ($\theta$) alumina, kappa ($\kappa$) or eta ($\eta$) alumina, and khi ($\chi$) alumina.

9. A coated cutting tool comprising:
a rake face and a flank face, a cutting edge being at the juncture of the rake face and the flank face, a substrate, and a coating bonded to the substrate;
the coating having a coating scheme including a first layer of titanium-aluminum alloy applied by physical vapor deposition, and a layer of alumina directly applied by physical vapor deposition to the first layer of the titanium-aluminum alloy, and at least one out layer of a material containing titanium applied to the layer of alumina.

10. The coated cutting tool of claim 1 wherein the first layer of titanium-aluminum alloy further includes one or more of the elements of zirconium, hafnium, vanadium, tantalum, and niobium.

11. The coated cutting tool of claim 9 wherein the one outer layer comprising titanium.

12. The coated cutting tool of claim 11 further including another outer layer of an alloy containing titanium and nitrogen applied to the one outer layer of titanium.

13. The coated cutting tool of claim 12 wherein the other outer layer comprises titanium nitride.

14. The coated cutting tool of claim 9 further including at least one intermediate layer of an alloy containing titanium and nitrogen between the first layer of the titanium-aluminum alloy and the substrate.

15. The coated cutting tool of claim 9 further including a first intermediate layer of titanium nitride applied directly to the surface of the substrate, a second intermediate layer of titanium carbonitride applied directly to the first intermediate layer, and the first layer being applied directly to the second intermediate layer.

16. The coated cutting tool of claim 9 wherein the first layer of titanium-aluminum alloy further contains one or more of the elements of zirconium, hafnium, vanadium, tantalum, and niobium.

17. The coated cutting tool of claim 16 wherein the titanium-aluminum alloy has a composition according to the following relationship: $(Ti_a Zr_b Hf_c V_d Ta_e Nb_f Al_{1-(a+b+c+d+e+f)})(N_x O_{1-x})$ wherein $0<a<1$; $0<(b+c+d+e+f)<1$; and $0<x<1$.

18. The coated cutting tool of claim 17 wherein the aluminum and oxygen contents of the first layer increase toward the alumina layer.

19. A coated cutting tool comprising:
a rake face and a flank face, a cutting edge being at the juncture of the rake face and the flank face, a substrate, and a coating bonded to the substrate;
the coating having a coating scheme including a first layer of a titanium-aluminum alloy applied by physical vapor deposition, a second layer of alumina directly applied by physical vapor deposition to the first layer of the titanium-aluminum alloy, a third layer of a titanium-aluminum alloy directly applied by physical vapor deposition to the second layer of alumina, and a fourth layer of alumina directly applied by physical vapor deposition to the third layer of the titanium-aluminum alloy.

20. The coated cutting tool of claim 19 wherein the first layer comprises titanium aluminum nitride, and the third layer comprises titanium aluminum nitride. titanium nitride, titanium carbide, titanium carbonitride and solid solutions thereof.

21. A coated cutting tool comprising:
a rake face and a flank face, a cutting edge being at the juncture of the rake face and the flank face, a substrate, and a coating bonded to the substrate;
the coating having a coating scheme including a first intermediate layer of titanium nitride applied directly to the surface of the substrate, a second intermediate layer of titanium carbonitride applied directly to the first intermediate layer, a first layer of titanium aluminum nitride applied by physical vapor deposition to the second intermediate layer, a second layer of titanium aluminum nitride applied by physical vapor deposition to the first layer wherein the composition of the second layer has a higher aluminum content than the composition of the first layer, and a first outer layer of alumina applied by physical vapor deposition to the second layer.

22. The coated cutting tool of claim 21 further including a second outer layer of a titanium-containing material applied to the first outer layer of alumina.

23. A coated cutting tool comprising:
a rake face and a flank face, a cutting edge being at the juncture of the rake face and the flank face, a substrate, and a coating bonded to the substrate;
the coating having a coating scheme including a first layer of a titanium-aluminum alloy applied by physical vapor deposition to the surface of the substrate, a second layer selected from the group consisting of one or more of titanium, aluminum and/or titanium-aluminum applied to the surface of the first layer, and an outer layer of alumina applied by physical vapor deposition to the surface of the second layer.

24. A coated cutting tool comprising:
a rake face and a flank face, a cutting edge being at the juncture of the rake face and the flank face, a substrate, and a coating bonded to the substrate;
the coating having a coating scheme including a first intermediate layer of titanium nitride applied directly to the surface of the substrate, a second intermediate layer of titanium carbonitride applied directly to the first intermediate layer, a first layer of titanium aluminum nitride applied by physical vapor deposition to the second intermediate layer, and a first outer layer of alumina applied by physical vapor deposition to the second layer.

* * * * *